(12) United States Patent
Koo et al.

(10) Patent No.: US 7,470,931 B2
(45) Date of Patent: Dec. 30, 2008

(54) THIN FILM TRANSISTOR AND FLAT PANEL DISPLAY USING THE SAME

(75) Inventors: Jae-Bon Koo, Suwon-si (KR); Min-Chul Suh, Suwon-si (KR); Yeon-Gon Mo, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/134,294

(22) Filed: May 23, 2005

(65) Prior Publication Data

US 2005/0258422 A1    Nov. 24, 2005

(30) Foreign Application Priority Data

May 24, 2004    (KR)    ............ 10-2004-0036953

(51) Int. Cl.
*H01L 29/76*    (2006.01)
(52) U.S. Cl. ............. 257/72; 257/40; 257/59; 257/406; 257/411; 257/E51.043; 257/E51.049; 257/E51.051
(58) Field of Classification Search ........... 257/40, 257/59, 72, 291, 406, 411
See application file for complete search history.

(56) References Cited

U.S. PATENT DOCUMENTS

| | | | | |
|---|---|---|---|---|
| 6,034,414 A | * | 3/2000 | Lin | ............ 257/600 |
| 6,869,821 B2 | * | 3/2005 | Knipp et al. | ............ 438/99 |
| 2004/0056246 A1 | * | 3/2004 | Yan et al. | ............ 257/40 |
| 2004/0238814 A1 | * | 12/2004 | Mizusaki et al. | ............ 257/40 |
| 2005/0202348 A1 | * | 9/2005 | Nakayama et al. | ............ 430/311 |
| 2006/0009614 A1 | * | 1/2006 | Yamahara et al. | ............ 528/380 |
| 2006/0102890 A1 | * | 5/2006 | Yamahara et al. | ............ 257/40 |
| 2006/0163559 A1 | * | 7/2006 | Koganei et al. | ............ 257/40 |
| 2007/0040165 A1 | * | 2/2007 | Dimmler et al. | ............ 257/40 |
| 2007/0126003 A1 | * | 6/2007 | Ando et al. | ............ 257/40 |
| 2007/0275181 A1 | * | 11/2007 | Carcia et al. | ............ 427/582 |

FOREIGN PATENT DOCUMENTS

| | | | |
|---|---|---|---|
| JP | 2-224275 | * | 9/1990 |
| JP | 2004-99874 | * | 4/2006 |
| KR | 10-2003-0085592 | | 11/2003 |

OTHER PUBLICATIONS

Katz et al., "The physical chemistry of organic field-effect transistors" J. Phys. Chem. B 2000, 104, 671-678.*

* cited by examiner

*Primary Examiner*—Ahmed Sefer
(74) *Attorney, Agent, or Firm*—H.C. Park & Associates, PLC

(57) ABSTRACT

A thin film transistor, and a flat panel display with the same, including a gate electrode, source and drain electrodes, an organic semiconductor layer, and a gate insulating layer. A first capacitance is a capacitance at a first point where the organic semiconductor layer, an electrode, and the gate insulating layer contact one another, a second capacitance is a capacitance at a second point where the organic semiconductor layer contacts the gate insulating layer, a third capacitance is a capacitance at a third point where the electrode contacts the gate insulating layer, and a fourth capacitance is a capacitance at a fourth point where the organic semiconductor layer contacts the electrode. The first capacitance is greater than one of the second capacitance, the third capacitance, and the fourth capacitance.

5 Claims, 4 Drawing Sheets

THIN FILM TRANSISTOR AND FLAT PANEL DISPLAY USING THE SAME

CROSS REFERENCE TO RELATED APPLICATION

This application claims priority to and the benefit of Korean Patent Application No. 10-2004-0036953, filed on May 24, 2004, which is hereby incorporated by reference for all purposes as if fully set forth herein.

BACKGROUND OF THE INVENTION

1. Field of the Invention

The present invention relates to a thin film transistor and a flat panel display including the same, and more particularly, to a thin film transistor with low contact resistance and a flat panel display including the same.

2. Discussion of the Background

Flat panel displays, such as liquid crystal display devices, organic and inorganic light emitting devices, etc., include many thin film transistors (TFTs). Generally, the TFTs function as a switching device, which turns a pixel on and off, and a driving device, which drives the pixel to emit light.

Each TFT may include a semiconductor layer, a gate electrode, and source and drain electrodes. The semiconductor layer includes source and drain regions, doped with high-concentration impurities, and a channel region interposed between the source and drain regions. The gate electrode is insulated from the semiconductor layer, and it may be located over the channel region. The source and drain electrodes are coupled with the source and drain regions, respectively.

However, the source and drain electrodes usually comprise a low work function metal to allow a smooth flow of electric charges. Consequently, a region where the low work function metal contacts the semiconductor layer may have a high contact resistance, thereby deteriorating the display device's characteristics and increasing its power consumption.

Therefore, various methods have been used to lower the contact resistance between a metal and a semiconductor layer. For example, when a semiconductor layer comprises amorphous silicon, an n+silicon layer may be interposed between the amorphous silicon and the metal source and drain electrodes to facilitate electron or hole migration. When a semiconductor layer comprises polysilicon, the polysilicon may be doped to improve the contact resistance between the metal and the semiconductor layer.

However, manufacturing such TFTs requires temperatures of at least 300° C. Hence, a plastic substrate, which is susceptible to heating, cannot be used.

Recent flat panel displays are being made thin and flexible.

In order to achieve this flexibility, the displays are typically manufactured using a plastic substrate instead of a conventional glass substrate. However, with plastic substrates, the manufacturing process must be performed at a low temperature. Therefore, a conventional polysilicon TFT may not be used.

To overcome this problem, a TFT including an organic semiconductor may be used, instead of the polysilicon TFT, because the organic semiconductor layer may be manufactured at low temperature.

However, a TFT including an organic semiconductor may have high contact resistance in a region where the organic semiconductor material contacts the metal source and drain electrodes. This contact resistance may be reduced using various methods. For example, a top portion of a gate insulating layer or a protecting layer, which is adjacent to an organic semiconductor layer, may be treated using self assembled monolayer (SAM) comprising a compound such as octadecyltrichlorosilane (OTS), hexamethyldisilazane (HMDS) etc., or it may be coated with a fluoride-containing polymer or a conventional polymer. For example, Korean Patent Laid-open Publication No. 2003-0085592 discloses a TFT including a doped channel adjacent to source and drain electrodes. In this case, first, a dopant is injected into the source and drain electrodes, and portions of a channel that is adjacent to the source and drain electrodes are exposed.

However, because this method may not acceptably reduce the contact resistance, there is a need to further decrease the contact resistance.

SUMMARY OF THE INVENTION

The present invention provides a TFT with low contact resistance between an organic semiconductor and source and drain electrodes, and a flat panel display including the same.

Additional features of the invention will be set forth in the description which follows, and in part will be apparent from the description, or may be learned by practice of the invention.

The present invention discloses a thin film transistor a gate electrode, a source electrode and a drain electrode, an organic semiconductor layer insulated from the gate electrode and contacting the source electrode and the drain electrode, and a gate insulating layer insulating the source electrode and the drain electrode from the gate electrode. A first capacitance is a capacitance at a first point where the organic semiconductor layer, an electrode, and the gate insulating layer contact one another. A second capacitance is a capacitance at a second point where the organic semiconductor layer contacts the gate insulating layer. A third capacitance is a capacitance at a third point where the electrode contacts the gate insulating layer. A fourth capacitance is a capacitance at a fourth point where the organic semiconductor layer contacts the electrode. The first capacitance is greater than one of the second capacitance, the third capacitance, and the fourth capacitance.

The present invention also discloses a flat panel display including the thin film transistor according to an exmpleayr embodiment of the present invention, wherein the TFT's source electrode or drain electrode is coupled with a pixel electrode.

The present invention also discloses a method for fabricating a thin film transistor including a gate electrode, a source electrode, and a drain electrode. The method comprises forming an organic semiconductor layer insulated from the gate electrode and contacting the source electrode and the drain electrode, and forming a gate insulating layer insulating the source electrode and the drain electrode from the gate electrode. The gate insulating layer is formed with a first portion and a second portion that are different from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
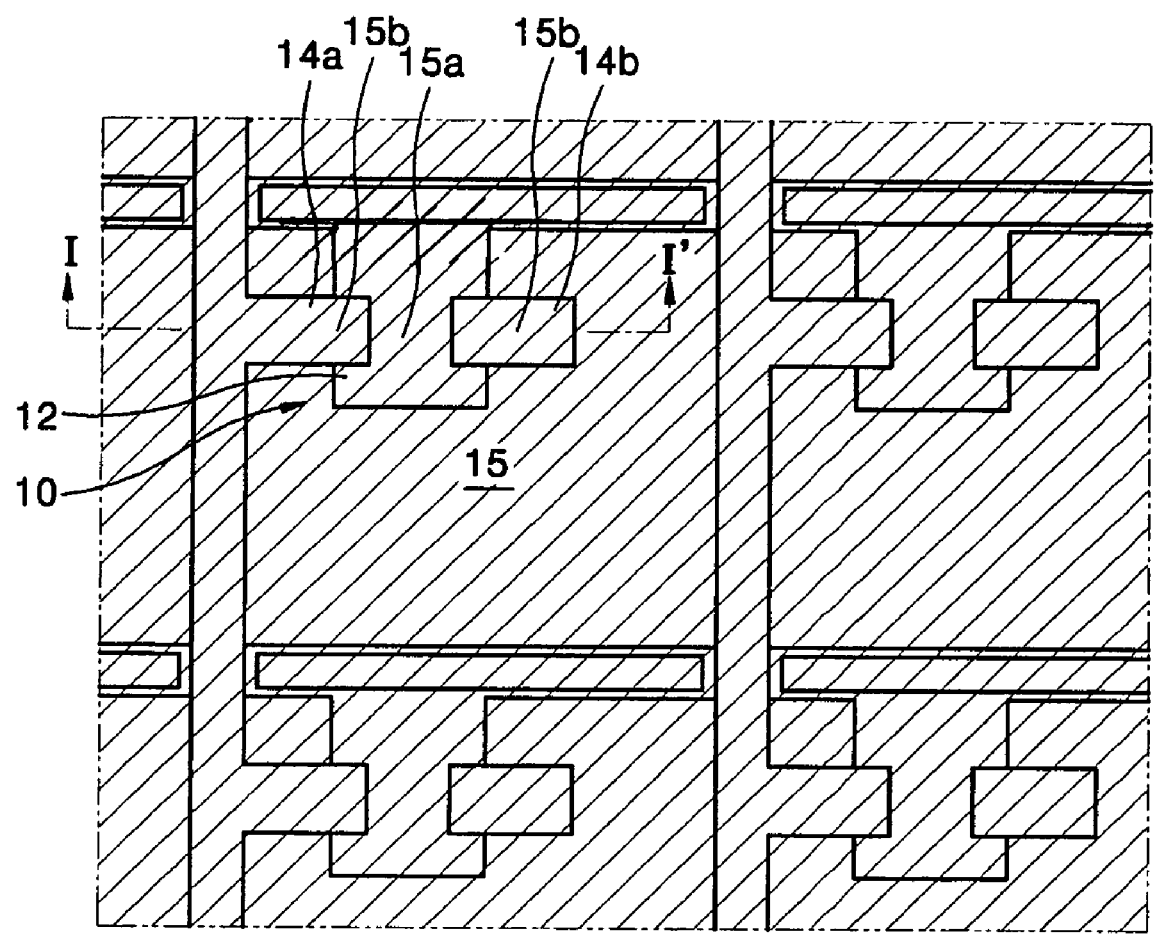
FIG. 1 is a plan view showing a TFT according to an exemplary embodiment of the present invention.
Figure 2:
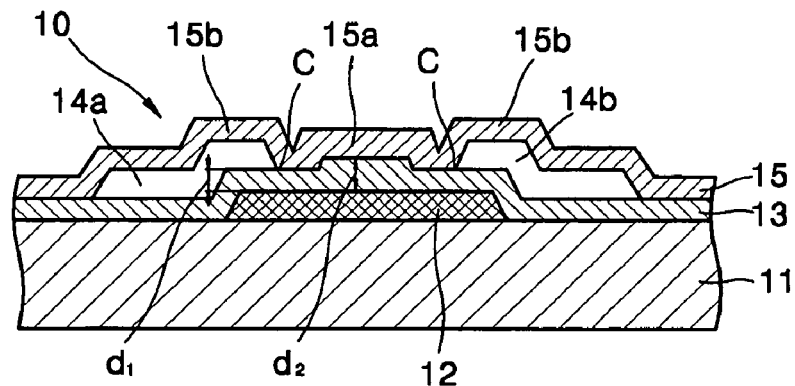
FIG. 2, FIG. 3 and FIG. 4 are sectional views taken along line I-I' of FIG. 1 showing TFTs according to exemplary embodiments of the present invention.
Figure 3:
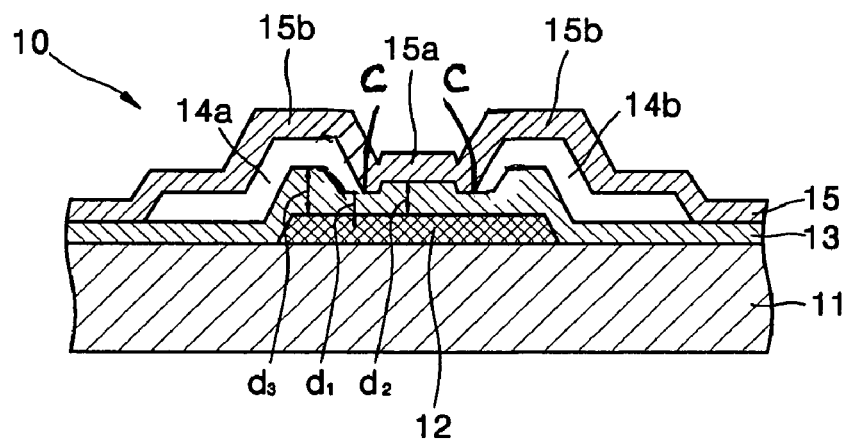
Figure 4:
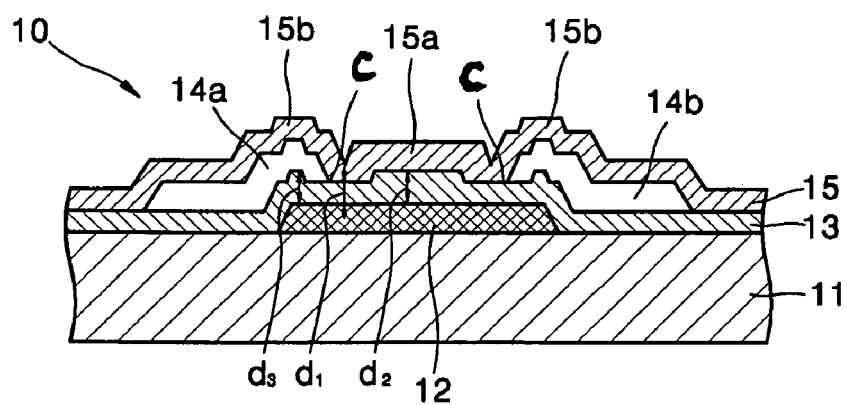

FIG. 1 is a plan view showing TFTs 10 according to an exemplary embodiment of the present invention, and FIG. 2, FIG. 3 and FIG. 4 are sectional views of a TFT along line I-I' of FIG. 1.

As shown in FIG. 1 and FIG. 2, the TFT 10 may be formed on a substrate 11, which may be made of glass, plastic, or other like materials. The TFTs 10 are formed adjacent to one another on the substrate 11, and they may have an identical structure. The structure of the TFT 10 will now be described.

A gate electrode 12, having a predetermined pattern, may be formed on the substrate 11, and a gate insulating layer 13 may cover the gate electrode. Source and drain electrodes 14a and 14b may be formed on the gate insulating layer 13. While FIG. 1 and FIG. 2 show the source and drain electrodes 14a and 14b overlapping a portion of the gate electrode 12, this is not necessary. An organic semiconductor layer 15 may be formed on the entire upper surface of the source and drain electrodes 14a and 14b.

The organic semiconductor layer 15 includes source and drain regions 15b, and a channel region 15a coupling the source and drain regions 15b. The organic semiconductor layer 15 may comprise an n-type or a p-type semiconductor. The source and drain regions 15b may be doped with an n-type or p-type impurity.

The organic semiconductor layer 15 comprises an organic semiconductor material. Examples of the organic semiconductor layer include pentacene, tetracene, anthracene, naphthalene, α-6-thiophene, α-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaphenylenevinylene and derivatives thereof, polyparaphenylene and derivatives thereof, polyflorene and derivatives thereof, polythiophenevinylene and derivatives thereof, a polythiophene-heteroringaromatic copolymer and derivatives thereof, oligoacene of naphtalene and derivatives thereof, oligothiophene of α-5-thiophene and derivatives thereof, metal-containing or metal-free phthalocyanine and derivatives thereof, pyromelitic dianhydride and derivatives thereof, and pyromelitic diimide and derivatives thereof, and other like materials.

The organic semiconductor layer 15 may have fewer organic semiconductor crystals in a region where the layer contacts the source and drain electrodes 14a and 14b than in regions where it does not contact the electrodes. Consequently, a grain boundary of the crystal in the region where the organic semiconductor layer 15 contacts the source and drain electrodes 14a and 14b increases, thereby increasing a trap site and contact resistance. In order to decrease the contact resistance, a first capacitance at a point C, which is where the organic semiconductor layer 15, the source or drain electrode 14a or 14b, and the gate insulating layer 13 contact one another, may be greater than at least one of a second capacitance of a portion where the organic semiconductor layer 15 contacts the gate insulating layer 13, a third capacitance of a portion where the source and drain electrodes 14a and 14b contact the gate insulating layer 13, and a fourth capacitance of a portion the organic semiconductor layer 15 contacts the source and drain electrodes 14a and 14b.

More specifically, the first capacitance may be greater than the second capacitance, the third capacitance, or both the second and third capacitances. The second and third capacitances may be equal.

Formula 1 shows that controlling capacitance may decrease the contact resistance.

$$V_{th} = qN_A t/C_{ox} \quad (1)$$

where $V_{th}$ is a threshold voltage, q is a number of electric charges, $N_A$ is a concentration of electric charges, t is a thickness of an organic semiconductor layer, and $C_{ox}$ is a capacitance.

According to formula 1, when the capacitance $C_{ox}$ increases, the threshold voltage $V_{th}$ decreases, thereby decreasing the contact resistance. Accordingly, if the capacitance at point C increases, the threshold voltage at point C decreases. Consequently, the contact resistance can be decreased at point C. Therefore, hole carriers may be easily collected at point C, so that a channel region may be easily formed to improve the TFT's reliability.

The capacitance at point C can be increased according to formula 2.

$$C_{ox} = \epsilon/d \quad (2)$$

, where $C_{ox}$ is the capacitance, $\epsilon$ is a dielectric constant, and d is layer thickness.

In detail, if a portion of the gate insulating layer 13 below point C is thin or it has a large dielectric constant, the capacitance may be increased. Hereinafter, exemplary embodiments of the present invention will be described in detail with reference to the drawings.

Referring to FIG. 2, a thickness $d_1$ of the gate insulating layer 13 below point C, where the organic semiconductor layer 15, the source or drain electrode electrodes 14a or 14b, and the gate insulating layer 13 all contact one another, may be less than a thickness $d_2$ of a portion of the gate insulating layer 13 where it contacts the organic semiconductor layer 15. In this case, due to the difference between $d_1$ and $d_2$, the first capacitance may be greater than the second capacitance. This embodiment uses the fact that the capacitance is inversely proportional to the thickness of the gate insulating layer 13, as formula 2 shows.

FIG. 3 is a sectional view showing a TFT according to another exemplary embodiment of the present invention. Referring to FIG. 3, a thickness $d_1$ of a portion of a gate insulating layer 13 below point C may be less than both a thickness $d_2$ and a thickness $d_3$. In this case, the thickness $d_2$ is a thickness of a portion of the gate insulating layer 13 where it contacts the organic semiconductor layer 15, and the thickness $d_3$ is a thickness of a portion of the gate insulating layer 13 where it contacts the source and drain electrodes 14a and 14b. The thickness $d_2$ may be less than the thickness $d_3$.

FIG. 4 is a sectional view showing a TFT according to another exemplary embodiment of the present invention. Referring to FIG. 4, a thickness $d_1$ of a gate insulating layer 13 below point C may be less than both a thickness $d_2$ and a thickness $d_3$. In this case, the thickness $d_2$ is a thickness of a portion of the gate insulating layer 13 where it contacts the organic semiconductor layer 15, and the thickness $d_3$ is a thickness of a portion of the gate insulating layer 13 where it contacts the source and drain electrodes 14a and 14b. The thickness $d_2$ may equal the thickness $d_3$.

As described above, in the TFTs shown in FIG. 2, FIG. 3 and FIG. 4, due to the difference in thicknesses of the gate insulating layer 13, a first capacitance at point C may be greater than a second capacitance where the organic semiconductor layer 15 contacts the gate insulating layer 13 and/or a third capacitance where the source and drain electrodes 14a and 14b contact the gate insulating layer 13.

The gate insulating layer 13 may be formed with a varying thickness by forming a first gate insulating layer using a conventional method. Then, a second gate insulating layer can be formed to a predetermined thickness on the first gate insulating layer using a mask. As a result, the varying thickness in the gate insulating layer may be obtained. Alternatively, a half tone mask may be used to simply control the intensity of exposure in a predetermined region, thereby providing the thickness differences in the gate insulating layer 13.

Figure 5:
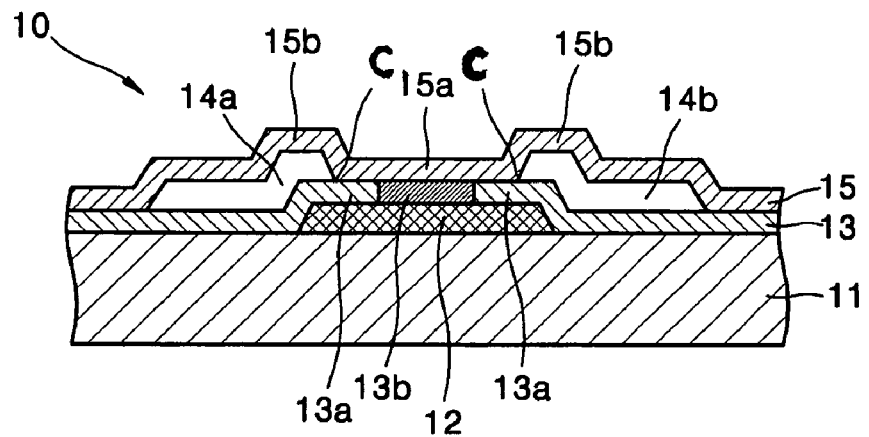
FIG. 5, FIG. 6 and FIG. 7 are sectional views taken along line I-I' of FIG. 1 showing TFTs according to other exemplary embodiments of the present invention.
Figure 6:
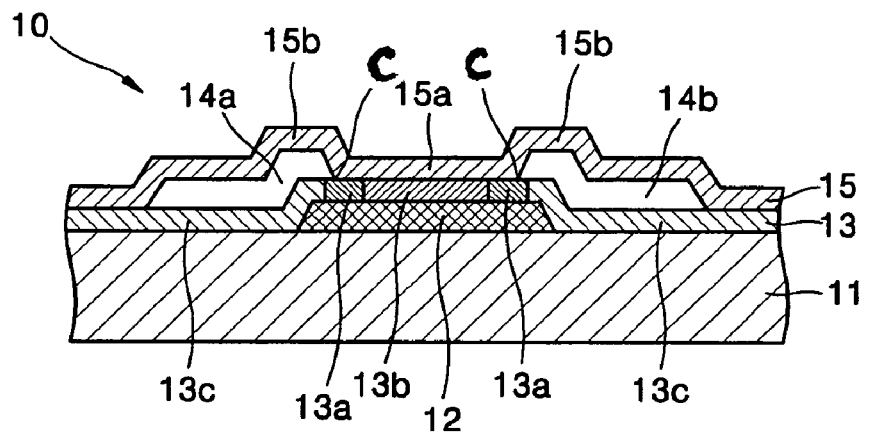
Figure 7:
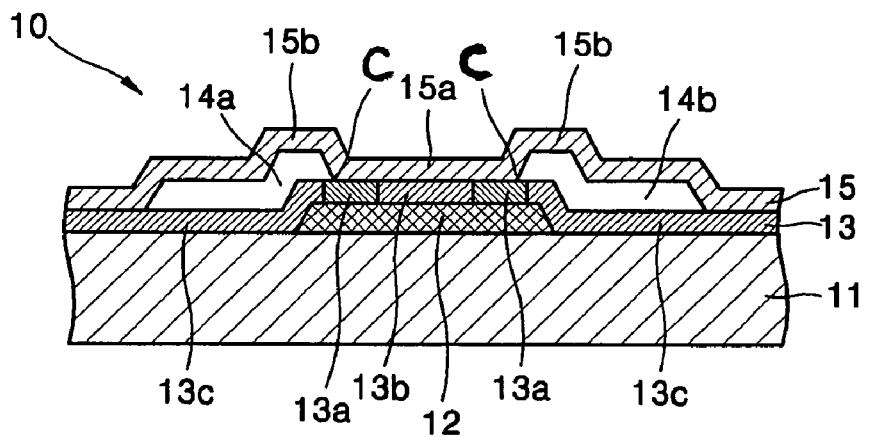

Additionally, in order to realize the different capacitances according to the present invention, as described above, a gate insulating layer may various dielectric constants. As formula 2 shows, the capacitance is proportional to the gate insulating layer's dielectric constant. Therefore, when portions of the gate insulating layer 13 have different dielectric constants, they may have different capacitances. FIG. 5, FIG. 6 and FIG. 7 are sectional views taken along line I-I' of FIG. 1 showing TFTs according to exemplary embodiments of the present invention.

A TFT according to an exemplary embodiment of the present invention may include a gate insulating layer having portions with different dielectric constants, thereby providing different capacitances, as mentioned above.

FIG. 5 is a sectional view showing a TFT according to an exemplary embodiment of the present invention. A dielectric constant $\epsilon_1$ of a portion 13a of a gate insulating layer 13 below point C may be greater than a dielectric constant $\epsilon_2$ of a portion 13b of the gate insulating layer 13 where it contacts the organic semiconductor layer 15. Due to the variation in the dielectric constant, which depends on locations in the gate insulting layer 13, a first capacitance at point C may be greater than a second capacitance of the portion 13b where the organic semiconductor layer 15 contacts the gate insulating layer 13.

FIG. 6 is a sectional view showing a TFT according to an exemplary embodiment of the present invention. A dielectric constant $\epsilon_1$ of a portion 13a of a gate insulating layer 13 below point C may be greater than both a dielectric constant $\epsilon_2$ of a portion 13b of the gate insulating layer 13 where it contacts the organic semiconductor layer 15 and a dielectric constant $\epsilon_3$ of a portion 13c of the gate insulating layer 13 where it contacts the source and drain electrodes 14a and 14b. The dielectric constant $\epsilon_2$ may be greater than the dielectric constant $\epsilon_3$.

FIG. 7 is a sectional view showing a TFT according to an another exemplary embodiment of the present invention. A dielectric constant $\epsilon_1$ of a portion 13a of a gate insulating layer 13 below point C may be greater than both a dielectric constant $\epsilon_2$ of a portion 13b of the gate insulating layer 13 where it contacts the organic semiconductor layer 15 and a dielectric constant $\epsilon_3$ of a portion 13c of the gate insulating layer 13 where it contacts the source and drain electrodes 14a and 14b. The dielectric constant $\epsilon_2$ may be equal to the dielectric constant $\epsilon_3$.

Due to the variation in the dielectric constant, which depends on locations in the gate insulting layer 13, in the TFTs illustrated in FIG. 5, FIG. 6 and FIG. 7, a first capacitance at point C may be greater than a second capacitance of the portion where the organic semiconductor layer 15 contacts the gate insulating layer 13 and/or a third capacitance of the portion where the source and drain electrodes 14a and 14b contact the gate insulating layer 13.

In the TFTs of FIG. 5, FIG. 6 and FIG. 7, the portion of the gate insulating layer 13a below point C may comprise at least a compound selected from a silicon oxide and a silicon nitride. In this case, the silicon oxide and silicon nitride may be at least a compound selected from $TiO_2$, $MgO$, $ZnO$, $Al_2O_3$, $SnO_2$, $In_2O_3$, $MgF_2$, $CaF_2$, and other like materials. At least a part of the portion 13b and the portion 13c of the gate insulating layer 13 may be at least a silicon oxide and a silicon nitride. Therefore, the gate insulating layer 13 of the TFT according to an exemplary embodiment of the present invention may have a varying dielectric constant using, e.g., doping or ion implanting.

An embodiment of the ion implanting, which may be used to provide a gate insulating layer having a varying dielectric constant, will now be described. First, a silicon oxide layer or a nitride layer may be formed to cover a gate electrode. A mask having a predetermined pattern may be arranged on the silicon oxide layer or the nitride layer. The mask may be patterned using a photolithography process after forming a Cr mask layer on the silicon oxide layer or the nitride layer. Then, ions may be implanted into the silicon oxide layer or the nitride layer on which the mask is formed. The ions may be ions of at least an element selected from Ti, Mg, Zn, Al, Sn, In, F, and Ca. After completing the ion implanting, the mask may be removed using, e.g., wet etching. As a result, the silicon oxide layer or the nitride layer includes a portion with implanted ions and a portion without implanted ions. The silicon oxide layer or the nitride layer may be heat treated in an oxidation condition to form a gate insulating layer according to an exemplary embodiment of the present invention.

The TFT according to exemplary embodiments of the present invention may have various laminated structures in addition to the above-mentioned laminated structures.

The TFT prepared in the above-mentioned manner may be used in flat panel displays, such as liquid crystal displays (LCDs) or organic electroluminescent display devices.

Figure 8:
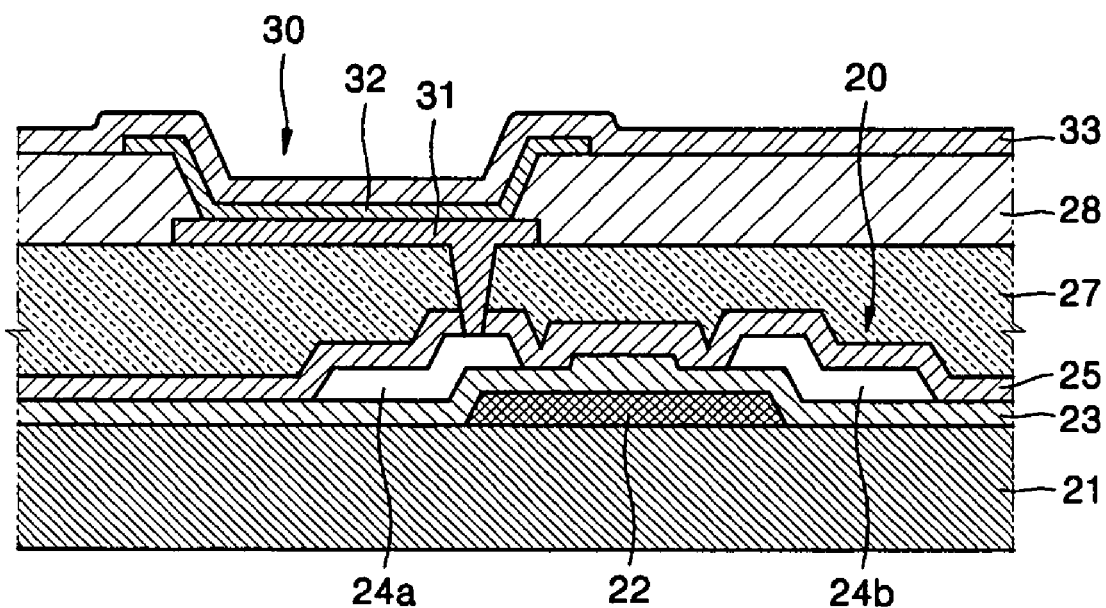
FIG. 8 is a sectional view showing an organic light emitting display device including the TFT of FIG. 2.

FIG. 8 is a sectional-view of an organic electroluminescent display device including the TFT of FIG. 2.

FIG. 8 shows a sub-pixel of the organic electroluminescent display device. The sub-pixel may include a self-emitting organic electroluminescent (EL) device 30, and at least one TFT 20. The sub-pixel further includes a capacitor (not shown).

The organic EL display device has a pixel pattern that depends on a luminescent color of an organic EL device. The organic EL display device may have a red sub-pixel, a green sub-pixel, or a blue sub-pixel.

The sub-pixels of red (R), green (G), and blue (B) may each have the TFT structure of FIG. 8 and a self-emitting organic EL device (OELD). In this case, the TFT may be one of the TFTs according to the above-mentioned exemplary embodiments, but is not limited thereto.

Referring to FIG. 8, the TFT 20 is formed over a substrate 21.

That is, a gate electrode 22 is formed in a predetermined pattern on the substrate 21, and a gate insulating layer 23 covers the gate electrode 22. Source and drain electrodes 24a and 24b may be formed on the gate insulating layer 23. The gate insulating layer 23 has a structure that provides varying capacitances, as mentioned above. Various embodiments of the gate insulating layer 23 will not be described here, because they may be the same as above.

An organic semiconductor layer 25 may cover the source and drain electrodes 24a and 24b.

The organic semiconductor layer 25 includes source and drain regions and a channel region coupling the source and drain regions to each other.

A passivation layer 27 may cover the TFT 20. The passivation layer 27 may be a single layer, or it may include multiple layers. Further, the passivation layer 27 may comprise an organic material, an inorganic material, or an organic/inorganic composite.

An organic luminescent layer 32 may be formed on a pixel defining layer 28 and on a pixel electrode 31.

The organic EL device 30 displays predetermined image information by emitting red light, green light, or blue light, according to current flow. The OELD 30 includes the pixel electrode 31 coupled with one of the source and drain electrodes 24a and 24b of the TFT 20, a counter electrode 33 covering the entire pixel, and the organic luminescent layer 32 interposed between the pixel electrode 31 and the counter electrode 33. The organic luminescent layer 32 insulates the pixel electrode 31 from the counter electrode 33, and it emits light when a voltage with different polarities is applied. However, the EL device 30 may have various structures.

The organic luminescent layer 32 may be a low molecular weight organic layer or a polymer organic layer. When a low molecular weight organic layer, it may include at least one of a hole injection layer (HIL), a hole transport layer (HTL), an emission layer (EML), an electron transport layer (ETL), an electron injection layer (EIL), etc. The low molecular weight organic layer may be made of copper phthalocyanine (CuPc), N,N'-di(naphthalene-1-yl)-N,N'-diphenyl-benzidine (NPB), tris-8-hydroxyquinoline aluminum (Alq3), or the like, and it may be formed using vacuum deposition.

When the organic luminescent layer 32 is a polymer organic layer, it may have an HTL/EML structure. The HTL may comprise poly-(3,4-ethylene-dioxythiophene) (PEDOT). The EML may comprise a polymer organic material, such as poly-phenylenevinylene (PPV), polyfluorene, or the like. The HTL and the EML may be formed using screen printing, ink-jet printing, or other like processes.

The organic luminescent layer is not limited to the above description, as it may have various structures.

The pixel electrode 31 may be an anode, and the counter electrode 33 may be a cathode. Alternatively, the pixel electrode 31 may be a cathode, and the counter electrode 33 may be an anode.

For a liquid crystal display device, a bottom counter layer (not shown) may cover the pixel electrode 31 when fabricating the device's bottom substrate.

The TFT according to the present invention may be included in a sub-pixel, and it may also be included in a driver circuit (not shown) that is not formed in a display area.

In addition, the substrate 21 of the organic EL device may be a flexible plastic substrate.

The present invention provides a TFT with low contact resistance between an organic semiconductor layer and source and drain electrodes. A flat panel display including the TFT may be highly reliable.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
   a gate electrode;
   a source electrode and a drain electrode;
   an organic semiconductor layer insulated from the gate electrode and contacting the source electrode and the drain electrode; and
   a gate insulating layer insulating the source electrode and the drain electrode from the gate electrode,
   wherein:
   a first capacitance is a capacitance at a first point per unit area where the organic semiconductor layer, one of the source electrode and the drain electrode, and the gate insulating layer contact one another,
   a second capacitance is a capacitance at a second point per unit area where the organic semiconductor layer contacts the gate insulating layer,
   a third capacitance is a capacitance at a third point per unit area where the one of the source electrode and the drain electrode contacts the gate insulating layer,
   a fourth capacitance is a capacitance at a fourth point per unit area where the organic semiconductor layer contacts the one of the source electrode and the drain electrode,
   the first capacitance is greater than one of the second capacitance, the third capacitance, and the fourth capacitance, and
   wherein a first dielectric constant of a first portion of the gate insulating layer below the first point is greater than one of a second dielectric constant of a second portion of the gate insulating layer below the second point and a third dielectric constant of a third portion of the gate insulating layer below the third point.

2. The thin film transistor of claim 1, wherein a first dielectric constant of a first portion of the gate insulating layer below the first point is greater than both a second dielectric constant of a second portion of the gate insulating layer below the second point and a third dielectric constant of a third portion of the gate insulating layer below the third point.

3. The thin film transistor of claim 1, wherein the first portion of the gate insulating layer comprises at least one of a silicon oxide and a silicon nitride,
   wherein the silicon oxide and the silicon nitride further include at least a compound selected from $TiO_2$, MgO, ZnO, $Al_2O_3$, $SnO_2$, $In_2O_3$, $MgF_2$, and $CaF_2$.

4. The thin film transistor of claim 3, wherein a part of the second portion of the gate insulating layer comprises at least one of a silicon oxide and a silicon nitride.

5. The thin film transistor of claim 3, wherein a part of the third portion of the gate insulating layer comprises at least one of a silicon oxide and a silicon nitride.

* * * * *